United States Patent
Peng et al.

(10) Patent No.: US 10,049,906 B1
(45) Date of Patent: Aug. 14, 2018

(54) SUBSTRATE PROCESSING APPARATUS

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Weigang Peng, Beijing (CN); Wei Zhou, Beijing (CN); Chengnan Hsieh, Beijing (CN); Yu Yang, Beijing (CN); Giseub Lim, Beijing (CN); Chen Yuan, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/545,441

(22) PCT Filed: Jan. 3, 2017

(86) PCT No.: PCT/CN2017/000027
§ 371 (c)(1),
(2) Date: Jul. 21, 2017

(87) PCT Pub. No.: WO2017/181731
PCT Pub. Date: Oct. 26, 2017

(30) Foreign Application Priority Data

Apr. 21, 2016 (CN) .......................... 2016 1 0252093

(51) Int. Cl.
*G03B 19/00* (2006.01)
*G03B 27/52* (2006.01)
(Continued)

(52) U.S. Cl.
CPC ........ *H01L 21/67259* (2013.01); *B08B 3/022* (2013.01); *G03F 7/0007* (2013.01);
(Continued)

(58) Field of Classification Search
CPC ... B08B 3/022; G03F 7/0007; G03F 7/70758; G03F 7/7085; G03F 7/70925;
(Continued)

(56) References Cited

U.S. PATENT DOCUMENTS 5,171,947 A 12/1992 Kusunoki et al.

FOREIGN PATENT DOCUMENTS

| CN | 1512555 A | 7/2004 |
| CN | 201952487 U | 8/2011 |

(Continued)

OTHER PUBLICATIONS

Chinese office action dated Nov. 28, 2017 for corresponding CN application 201610252093.6 with English translation attached.
(Continued)

*Primary Examiner* — Colin Kreutzer
(74) *Attorney, Agent, or Firm* — Nath, Goldberg & Meyer; Joshua B. Goldberg

(57) ABSTRACT

Provided is a substrate processing apparatus, which comprises a processing chamber, a substrate sensing assembly, a rotation shaft and a driving assembly. A portion of the rotation shaft is provided inside the processing chamber and the remaining portion thereof is provided outside the processing chamber. The substrate sensing assembly is provided on the portion of the rotation shaft outside the processing chamber. The driving assembly is fixed at the portion of the rotation shaft inside the processing chamber. The driving assembly drives, when coming into contact with the substrate, the rotation shaft to rotate about its own axis along a first direction, and drives, when the substrate comes
(Continued)

into no contact with the driving assembly, the rotation shaft to rotate about its axis along a second direction opposite to the first direction. The treatment liquid does not affect the substrate sensing assembly since it is provided outside the processing chamber.

20 Claims, 2 Drawing Sheets

(51) Int. Cl.
*G03B 27/58* (2006.01)
*H01L 21/67* (2006.01)
*H01L 21/687* (2006.01)
*B08B 3/02* (2006.01)
*G03F 7/20* (2006.01)
*G03F 7/00* (2006.01)

(52) U.S. Cl.
CPC ........ *G03F 7/7085* (2013.01); *G03F 7/70758* (2013.01); *G03F 7/70925* (2013.01); *H01L 21/67023* (2013.01); *H01L 21/68764* (2013.01)

(58) Field of Classification Search
CPC ......... H01L 21/67023; H01L 21/67259; H01L 21/68764
USPC ....... 118/720; 355/30, 72; 396/611; 438/906
See application file for complete search history.

(56) References Cited

FOREIGN PATENT DOCUMENTS

| | | |
|---|---|---|
| CN | 104617018 A | 5/2015 |
| CN | 105679698 A | 6/2016 |
| KR | 10-2014-0067422 A | 6/2014 |

OTHER PUBLICATIONS

International Search Report forms 210, 220, 237 dated Apr. 7, 2017 in corresponding International Application No. PCT/CN2017/000027 along with an English translation of the International Search Report and an English translation of the Written Opinion of the International Searching Authority.

SUBSTRATE PROCESSING APPARATUS

This is a National Phase Application filed under 35 U.S.C. 371 as a national stage of PCT/CN2017/000027, filed Jan. 3, 2017, an application claiming the benefit of Chinese Application No. 201610252093.6, filed Apr. 21, 2016, the content of each of which is hereby incorporated by reference in its entirety.

TECHNICAL FIELD

The present invention relates to the field of display device manufacturing, and particularly to a substrate processing apparatus.

BACKGROUND

In the manufacture of a display device, processes such as cleaning and developing need to be performed on a substrate. During the above processes, the substrate is transported into a processing chamber of a substrate processing apparatus, and then the treatment liquid is sprayed towards the substrate by a spraying mechanism. Typically, the processing chamber of the substrate processing apparatus is provided with a sensor therein for sensing whether or not the substrate enters the processing chamber.

Since the sensor is provided inside the processing chamber, the treatment liquid may be sprayed onto the sensor when the treatment liquid is sprayed towards the substrate, resulting in failure of the sensor.

Therefore, how to avoid sensor failure has become an urgent technical problem to be solved in the art.

SUMMARY

The present disclosure provides a substrate processing apparatus for sensing a substrate and not prone to failure.

To achieve the above object(s), the present disclosure provides a substrate processing apparatus which includes a processing chamber and a substrate sensing assembly, and further includes:
- a rotation shaft, which has a portion provided inside the processing chamber and the remaining portion provided outside the processing chamber, the substrate sensing assembly being provided on the portion of the rotation shaft outside the processing chamber; and
- a driving assembly fixed at the portion of the rotation shaft inside the processing chamber;
- wherein the driving assembly drives, when coming into contact with the substrate, the rotation shaft to rotate about its own axis along a first direction, and the substrate sensing assembly transmits, upon sensing the rotation of the rotation shaft along the first direction, a first sensing signal indicative of the substrate entering into the processing chamber;
- the driving assembly drives, when the substrate comes into no contact with the driving assembly from in contact with the driving assembly, the rotation shaft to rotate about its own axis along a second direction opposite to the first direction, and the substrate sensing assembly stop transmitting the first sensing signal upon sensing the rotation of the rotation shaft along the second direction.

In some exemplary embodiments, the substrate sensing assembly may include a substrate sensor and a sense element, one of which is configured to rotate with the rotation of the rotation shaft, and the other one of which is provided stationary with respect to the processing chamber;
- when the rotation shaft rotates by a first angle along the first direction, the substrate sensor and the sense element become close to each other such that the sense element enters into a sensing range of the substrate sensor, and the substrate sensor transmits the first sensing signal; and
- when the rotation shaft rotates by a second angle along the second direction, the substrate sensor and the sense element become away from each other such that the sense element is out of the sensing range of the substrate sensor, and the substrate sensor stops transmitting the first sensing signal.

In some exemplary embodiments, the substrate sensing assembly may further include a mounting bracket provided stationary with respect to the processing chamber, and the other one of the substrate sensor and the sense element provided stationary with respect to the processing chamber is fixedly provided on the mounting bracket.

In some exemplary embodiments, the substrate sensor may be provided stationary with respect to the processing chamber, and the sense element may be fixedly provided on the rotation shaft so as to rotate with the rotation of the rotation shaft.

In some exemplary embodiments, the substrate sensor is provided on the mounting bracket, and the sense element is provided on the rotation shaft.

In some exemplary embodiments, the substrate sensor is provided on the mounting bracket, the sense element is fixedly provided on the rotation shaft, and the substrate processing apparatus may further include an initial position sensor provided on the mounting bracket, wherein the initial position sensor and the substrate sensor are positioned at two ends of a movement trajectory of the sense element, respectively, when the driving assembly is not in contact with the substrate, the driving assembly fixes the rotation shaft at such an initial position that the sense element is in a sensing range of the initial position sensor, and when the sense element is in the sensing range of the initial position sensor, the initial position sensor transmits a second sensing signal.

In some exemplary embodiments, the substrate sensor includes a first groove, and the initial position sensor includes a second groove, when the driving assembly comes into contact with the substrate, one end of the sense element enters into the first groove, and when the driving assembly is not in contact with the substrate, the other end of the sense element enters into the second groove.

In some exemplary embodiments, the sense element has an annulus-sector shape, and the substrate processing apparatus further includes a supporting rod, one end of which is fixedly provided on the rotation shaft, the other end of which is fixedly provided with the sense element thereon, and an extension line of which crosses the axis of the rotation shaft, a center of a circle of the annulus-sector shaped sense element being on the supporting rod.

In some exemplary embodiments, the driving assembly includes a lever fixedly connected to the rotation shaft, a counterweight provided at one end of the lever and a contact member provided at the other end of the lever, the lever being configured to drive the rotation shaft to rotate about the axis of the rotation shaft when the contact member comes into contact with the substrate; and
- the substrate processing apparatus further includes a counterweight stopper provided inside the processing chamber and under the lever, the counterweight stopper being configured to stop the one end of the lever provided with the counterweight when the contact member is not in contact with the substrate.

In some exemplary embodiments, a distance between the counterweight and a connection point of the lever with the rotation shaft is less than a distance between the contact member and the connection point of the lever with the rotation shaft.

In some exemplary embodiments, the contact member includes a roller configured to roll when the substrate comes into contact with an outer surface of the roller and presses down the lever.

In some exemplary embodiments, the counterweight stopper includes a stop bar, and the substrate processing apparatus further includes a mounting rod, one end of which is provided with the stop bar, and the other end of which is configured to fix the mounting rod inside the processing chamber, the mounting rod and the stop bar being perpendicular to each other.

In some exemplary embodiments, the substrate processing apparatus may further include an adjustment mechanism, and the mounting rod is a telescopic rod, the adjustment mechanism includes an operation part and an execution part connected between the mounting rod and the operation part, the operation part being provided outside the processing chamber so that a force applied to the operation part is transmitted to the mounting rod through the execution part to control the mounting rod to be lengthened or shortened.

In some exemplary embodiments, the substrate processing apparatus may further include a controller and a spraying mechanism, the spraying mechanism being provided inside the processing chamber, and the controller being configured to control, upon receiving the first sensing signal, the spraying mechanism to spray.

In some exemplary embodiments, the substrate processing apparatus may further include a controller and a spraying mechanism, the spraying mechanism being provided inside the processing chamber, and the controller being configured to control, upon receiving the second sensing signal, the spraying mechanism to stop spraying.

In some exemplary embodiments, the substrate processing apparatus may further include a plurality of transmission shafts provided inside the processing chamber, and the rotation shaft is provided between two adjacent transmission shafts.

In some exemplary embodiments, the rotation shaft has a rod shape, and at least one of two ends of the rotation shaft is provided outside the processing chamber.

In the substrate processing apparatus provided by the embodiments of the present invention, since the substrate sensor and the sense element are provided outside the processing chamber, the treatment liquid does not affect the substrate sensor. In addition, once the substrate sensor has failed, the failure can be found in time, thereby avoiding breakdown of apparatus, lamination and breakage of substrate and so on caused by the failure of the substrate sensor.

BRIEF DESCRIPTION OF THE DRAWINGS

The accompanying drawings, which constitute a part of the specification, are provided for further understanding of embodiments of the present invention, and for explaining the present invention together with the following specific implementations, but not intended to limit the present invention, in which.

DETAILED DESCRIPTION

Specific embodiments of the present invention will be described below in detail in conjunction with the accompanying drawings. It should be understood that the embodiments to be described are merely intended to illustrate and explain the present invention, but not to limit the present invention.

Figure 1:
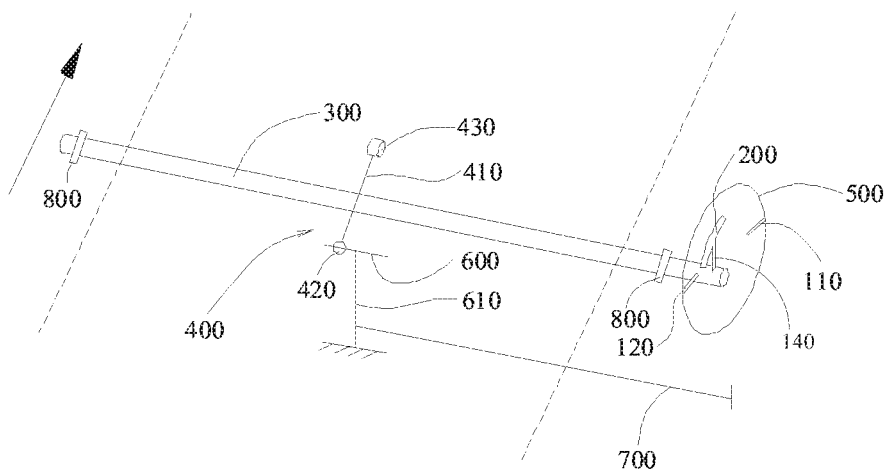
FIG. 1 is a schematic structural diagram of a substrate processing apparatus according to an embodiment of the present invention.

As one aspect of the present disclosure, there is provided a substrate processing apparatus which includes a processing chamber and a substrate sensing assembly, and as illustrated in FIG. 1, the substrate processing apparatus further includes a rotation shaft 300 and a driving assembly 400.

A portion of the rotation shaft 300 is provided inside the processing chamber (as illustrated in Fig. 1, two dotted lines represent boundaries of the processing chamber, and a portion between the dotted lines represents the interior of the processing chamber), and at least one of two end portions of the rotation shaft 300 extends to the outside of the processing chamber. The substrate sensing assembly is provided on the rotation shaft 300 and outside the processing chamber.

As illustrated in FIG. 1, the driving assembly 400 is fixed at the portion of the rotation shaft 300 inside the processing chamber.

When coming into contact with a to-be-processed substrate, the driving assembly 400 may drive the rotation shaft 300 to rotate about its own axis along a first direction, and when the rotation shaft 300 rotates by a first angle along the first direction, the substrate sensing assembly may transmit a first sensing signal indicative of the entry of the substrate into the processing chamber.

In addition, when the substrate comes into no contact with the driving assembly 400 from in contact with the driving assembly 400, the driving assembly 400 may drive the rotation shaft 300 to rotate about its own axis along a second direction opposite to the first direction, and when the rotation shaft 300 rotates by a second angle along the second direction, the substrate sensing assembly stop transmitting the first sensing signal.

In the present application, the first direction may be a clockwise direction or a counterclockwise direction, depending on the conveying direction of the substrate. When the first direction is a clockwise direction, the second direction is a counterclockwise direction and vice versa. The first angle and the second angle are predetermined angles, and they may be equal to each other or may not be equal to each other.

When a substrate comes into contact with the driving assembly 400, the driving assembly 400 drives the rotation shaft 300 to rotate about its own axis along the first direction. After the rotation shaft 300 rotates by the first angle, the substrate sensing assembly transmits the first sensing signal to a controller for controlling a spraying mechanism to spray, and upon receiving the sensing signal, the controller controls the spraying mechanism to start the spraying of the treatment liquid. Since the substrate sensing assembly is provided outside the processing chamber, the treatment liquid may be not sprayed onto the substrate sensing assembly, and thus the substrate sensing assembly does not fail due to the treatment liquid, so that the lifetime of the substrate processing apparatus can be improved.

In addition to the advantage of long lifetime, the substrate processing apparatus also has the following advantages. Since the substrate sensing assembly is provided outside the processing chamber, once the substrate sensing assembly has failed, the failure can be found in time, and the failed substrate sensing assembly can be replaced easily, thereby avoiding breakdown of apparatus, lamination and breakage of substrate and so on caused by the failure of the substrate sensing assembly.

In the present application, the specific structure of the substrate sensing assembly is not particularly limited. For example, the substrate sensing assembly may include an angular sensor for measuring an angle by which the rotation shaft 300 rotates.

In an embodiment of the present invention, the substrate sensing assembly includes a substrate sensor 110 and a sense element 200. One of the substrate sensor 110 and the sense element 200 is configured to rotate with the rotation of the rotation shaft 300, and the other of the substrate sensor 110 and the sense element 200 is provided stationary with respect to the processing chamber. For example, one of the substrate sensor 110 and the sense element 200 may be fixedly attached to the rotation shaft 300.

As the rotation shaft 300 rotates by the first angle along the first direction, the substrate sensor 110 and the sense element 200 become close to each other such that the sense element 200 enters into a sensing range of the substrate sensor 110, and the substrate sensor 110 transmits the first sensing signal.

As the rotation shaft 300 rotates by the second angle along the second direction, the substrate sensor 110 and the sense element 200 become away from each other such that the sense element 200 is out of the sensing range of the substrate sensor 110, and the substrate sensor 110 stops transmitting the first sensing signal.

The substrate sensor 110 and the sense element 200 have low cost and are easy to install, so the overall cost of the substrate processing apparatus can be reduced by using the substrate sensing assembly including the substrate sensor 110 and the sense element 200.

For ease of installation, in an embodiment of the present application, the substrate sensing assembly may further include a mounting bracket 500 provided stationary with respect to the processing chamber, and the other one of the substrate sensor 110 and the sense element 200 provided stationary with respect to the processing chamber is fixedly provided on the mounting bracket 500.

Because the substrate sensor 110 is connected with signal transmission lines, in some exemplary embodiments, the substrate sensor 110 is stationary with respect to the processing chamber and the sense element 200 rotates with the rotation of the rotation shaft 300, thereby preventing the signal transmission lines of the substrate sensor 110 from being caught or dragged. Accordingly, the substrate sensor 110 is fixedly provided on the mounting bracket 500, and the sense element 200 is provided on the rotation shaft 300.

In an embodiment of the present invention, for ease of monitoring, the substrate processing apparatus further includes an initial position sensor 120 fixedly provided on the mounting bracket 500, wherein the initial position sensor 120 and the substrate sensor 110 are positioned at two ends of a movement trajectory of the sense element 200, respectively. For example, the initial position sensor 120 and the substrate sensor 110 may be positioned on two sides of the mounting bracket, respectively. When the driving assembly 400 is not in contact with the substrate, the driving assembly 400 may fix the rotation shaft 300 such that the sense element 200 is in a sensing range of the initial position sensor 120, and once the sense element 200 is in the sensing range of the initial position sensor 120, the initial position sensor 120 may transmit a second sensing signal.

Figure 2:
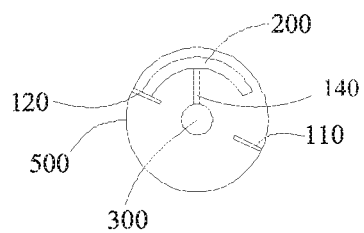
FIG. 2 is a schematic diagram of a substrate sensing assembly including a mounting bracket in a case where a sense element is in an initial state.
Figure 3:
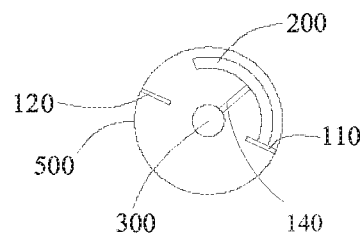
FIG. 3 is a schematic diagram of the substrate sensing assembly including the mounting bracket in a case where the sense element is in a final state.

As illustrated in FIG. 2, when the driving assembly 400 is not in contact with the substrate, the sense element 200 is in the sensing range of the initial position sensor 120, and at this time, the initial position sensor 120 may generate the second sensing signal indicative of the absence of the substrate inside the processing chamber. As illustrated in FIG. 3, when the driving assembly comes into contact with the substrate, the sense element 200 is in the sensing range of the substrate sensor 110, and at this time, the substrate sensor 110 may generate the first sensing signal indicative of the presence of the substrate inside the processing chamber.

The controller may determine, upon receiving the second sensing signal transmitted by the initial position sensor 120, that there is no substrate inside the processing chamber, and thus may control the spraying mechanism to stop spraying the treatment liquid.

Figure 4:
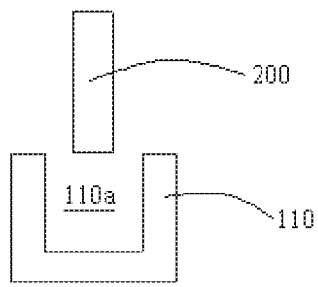
FIG. 4 is a schematic diagram illustrating the sense element not entering into a sensing range of a substrate sensor.
Figure 5:
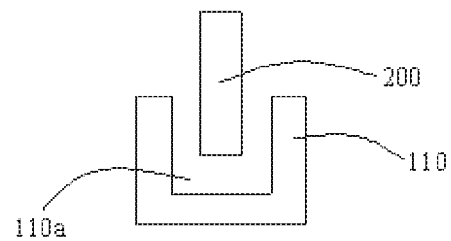
FIG. 5 is a schematic diagram illustrating the sense element entering into the sensing range of a substrate sensor.

In the present application, the specific structures of the substrate sensor 110 and the initial position sensor 120 are not particularly limited. For example, as illustrated in FIGS. 4 and 5, the substrate sensor 110 includes a first groove 110a, and one end of the sense element 200 can enter into the first groove. Similarly, the initial position sensor includes a second groove, and the other end of the sense element 200 can enter into the second groove.

As illustrated in FIG. 2, when there is no substrate inside the processing chamber, the rotation shaft 300 is driven by the driving assembly 400 to the initial position, and one end of the sense element 200 is inserted into the second groove. When a substrate is inside the processing chamber, the rotation shaft 300 is driven by the driving assembly 400 to rotate such that the other end of the sense element 200 is inserted into the first groove, as illustrated in FIG. 3.

Since the movement trajectory of the sense element 200 is arc-shaped, in some exemplary embodiments, in order to facilitate the sense element 200 to enter into the sensing ranges of the initial position sensor 120 and the substrate sensing sensor 110, respectively, the sense element 120 is formed in an annular-sector shape, as illustrated in FIGS. 2 and 3. Accordingly, the substrate processing apparatus further includes a supporting rod 140. One end of the supporting rod 140 is fixedly provided on the rotation shaft 300, the other end of the supporting rod 140 is fixedly provided with the sense element 200 thereon, an extension line of the supporting rod 140 crosses the axis of the rotation shaft 300, and a center of a circle of the annulus-sector shaped sense element 200 is on the supporting rod 140.

In the present application, the specific structure of the driving assembly 400 is not particularly limited. For example, in an embodiment as illustrated in FIG. 1, the driving assembly 400 includes a lever 410, a counterweight 420 provided at one end of the lever 410 and a contact member 430 provided at the other end of the lever 410. The substrate processing substrate further includes a counterweight stopper 600, which is provided under the rotation shaft 300 and inside the processing chamber. The lever 410 is provided on the rotation shaft 300, and can rotate, along with the rotation of the rotation shaft 300, about the axis of the rotation shaft 300. The contact member 430 is configured to contact with the substrate. When the contact member 430 is not in contact with a substrate, a portion of the lever 410 between one end of the lever 410 provided with the counterweight 420 and the connection point of the lever 410 with the rotation shaft 300 may be supported by the counterweight stopper 600.

When a to-be-processed substrate enters the processing chamber and comes into contact with the contact member 430 on the lever 410, the contact member 430 on the lever will be pressed down due to the forward movement of the substrate. Since the lever is fixed on the rotation shaft 300, the rotation of the lever will cause the rotation shaft 300 to rotate about its own axis, and when the rotation shaft 300 rotates by the first angle, the substrate sensing assembly transmits the first sensing signal.

In embodiments where the substrate sensing assembly includes the sense element 200 and the substrate sensor 110, the rotation of the rotation shaft 300 causes one of the sense element 200 and the substrate sensor 110 to move, such that a distance between the sense element 200 and the substrate sensor 110 is gradually reduced and eventually the sense element 200 enters into the sensing range of the substrate sensor 110.

The driving assembly 400 having the above-described arrangement can be driven to rotate by the movement of the substrate without any other power source for providing driving force. Thus, energy consumption can be reduced by using the driving assembly 400 having the above-described arrangement.

In some exemplary embodiments, a distance between the counterweight 420 and the connection point of the lever 410 with the rotation shaft 300 is less than a distance between the contact member 430 and the connection point of the lever 410 with the rotation shaft 300, so that the stroke of the contact member 430 after contacting with the substrate can be increased, and the probability that the driving assembly erroneously drives the rotation shaft 300 can be reduced, thereby improving the stability and accuracy for detecting the substrate.

In some exemplary embodiments, in order to reduce the frictional force between the substrate and the lever assembly and to prevent the substrate from being scratched, the contact member 430 may include a roller which is configured to roll when the substrate comes into contact with its outer surface and presses down the lever 410.

In the present application, the specific structure of the counterweight stopper 600 is not particularly limited. In an embodiment as illustrated in FIG. 1, the counterweight stopper 600 includes a stop bar, and the substrate processing apparatus may further include a mounting rod 610, and the counterweight stopper 600 formed as the stop bar is provided at one end of the mounting rod 610, and the other end of the mounting rod 610 is mounted inside the processing chamber. The mounting rod 610 and the counterweight stopper 600 are perpendicular to each other. In the initial state, the one end of the lever 410 provided with the counterweight 420 leans against the counterweight stopper 600.

In some exemplary embodiments, for ease of adjustment, the mounting rod 610 is a telescopic rod, and the substrate processing apparatus further includes an adjustment mechanism 700. The adjustment mechanism 700 includes an operation part 710 and an execution part 720. The execution part 720 is connected with the mounting rod and configured to adjust the length of the mounting rode 610, and the operation part 710 is provided outside the processing chamber and configured to operate the execution part 720.

For example, the mounting rod 610 may include a cylinder, the operation part 710 of the adjustment mechanism 700 may include a pneumatic valve, and the execution part 720 of the adjustment mechanism 700 may include a pipe. By operating the operation part 710, communication condition of the mounting rod 610 with a gas source can be controlled, and the mounting rod 610 can be controlled to be lengthened or to be shortened, and thereby the height of the counterweight stopper 600 can be controlled.

In the present application, both ends of the rotation shaft 300 are supported in holes on side walls of the processing chamber. For ease of the rotation of the rotation shaft 300, in some exemplary embodiments, the substrate processing apparatus further includes two bearings 800 provided around two ends of the rotation shaft 300, respectively, and the sense element 200 and the substrate sensor 110 are positioned at a side of one of the bearings 800 distal to the processing chamber, the one of the bearings 800, the sense element 200 and the substrate sensor 110 being at the same side of the processing chamber.

As described above, the substrate processing apparatus further includes a controller and a spraying mechanism. The spraying mechanism includes a spraying head provided inside the processing chamber. An output terminal of the controller is connected to a control terminal of the spraying mechanism, and an input terminal of the controller is connected to an output terminal of the substrate sensing assembly. Upon receiving the first sensing signal from the substrate sensing assembly, the controller transmits a first control signal to the control terminal of the spraying mechanism to control the spraying mechanism to spray.

In a case where the substrate processing apparatus further includes the initial position sensor, the input terminal of the controller is connected to the output terminal of the substrate sensing assembly. Upon receiving the second sensing signal, the controller transmits a second control signal to the spraying mechanism to control the spraying mechanism to stop spraying.

Figure 6:
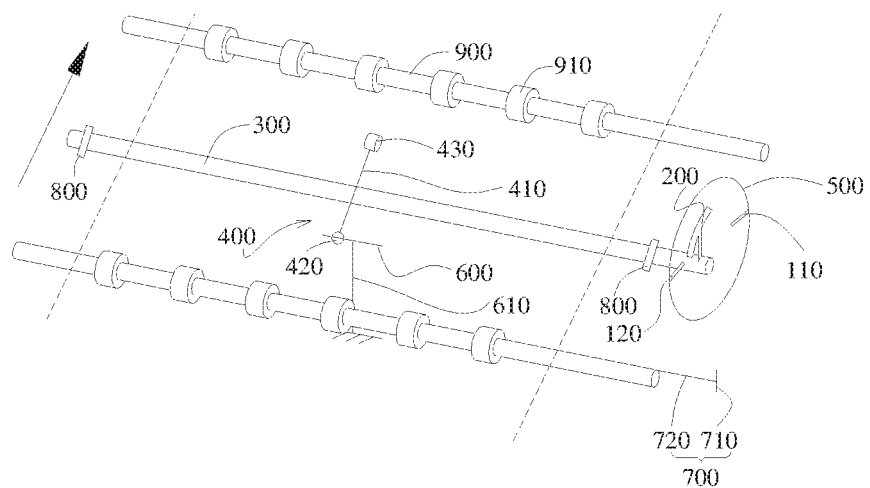
FIG. 6 is a schematic diagram illustrating a positional relationship between a transmission shaft and a rotation shaft in a substrate processing apparatus according to an embodiment of the present invention.

For ease of conveying the substrate, in some exemplary embodiments as illustrated in FIG. 6, the substrate processing apparatus includes a plurality of transmission shafts 900 provided inside the processing chamber, and the rotation shaft 300 is provided between two adjacent transmission shafts 900. The transmission shaft 900 is provided with transmission rollers 910 and can rotate about its own axis so as to transfer the substrate entering the processing chamber to the outside of the processing chamber.

The operation principle of the substrate processing apparatus according to embodiments of the present invention will be described below with reference to FIG. 6.

As illustrated in the drawing, the rotation shaft 300 is provided between two transmission shafts 900.

When there is no substrate inside the processing chamber, driven by the counterweight, the sense element 200 is in the sensing range of the initial position sensor 120, and the initial position sensor 120 transmits the second sensing signal to the controller, so the controller controls the spraying mechanism not to spray the treatment liquid.

When the substrate enters into the processing chamber through an entry of the processing chamber, the transmission shaft 900 rotates to drive the substrate to move along a direction indicated by an arrow in FIG. 6.

Once the substrate contacts the contact member 430, the contact member 430 is pressed downward, drives the rotation shaft 300 to rotate about its own axis along the first direction, and drives the sense element 200 to move towards the substrate sensor 110 and eventually enter into the sensing range of the substrate sensor 110. At this moment, the substrate sensor 110 transmits the first sensing signal to the controller so as to control the spraying mechanism to spray the treatment liquid into the processing chamber.

The transmission shaft 900 continues to drive the substrate to move along the direction indicated by the arrow, and when the substrate comes into no contact with the contact member 430, the counterweight 420 drives the rotation shaft 300 to rotate counterclockwise, and drives the sense element 200 to move towards the initial position sensor 120. The initial position sensor 120 transmits the second sensing signal to the controller when the sense element 200 completely reaches the sensing range of the initial position sensor 120, and the controller controls the spraying mechanism to stop spraying.

It can be understood that the foregoing embodiments are merely exemplary embodiments used for describing the principle of the present invention, but the present invention is not limited thereto. Those of ordinary skill in the art may make various variations and improvements without departing from the spirit and essence of the present invention, and these variations and improvements shall also fall into the protection scope of the present invention.

What is claimed is:

1. A substrate processing apparatus, comprising:
   a processing chamber;
   a substrate sensing assembly;
   a rotation shaft, which has a portion provided inside the processing chamber and the remaining portion provided outside the processing chamber, the substrate sensing assembly being provided on the portion of the rotation shaft outside the processing chamber; and
   a driving assembly fixed at the portion of the rotation shaft inside the processing chamber;
   wherein the driving assembly is configured to drive, when coming into contact with the substrate, the rotation shaft to rotate about an axis of the rotation shaft along a first direction, and the substrate sensing assembly is configured to transmit, upon sensing the rotation of the rotation shaft along the first direction, a first sensing signal indicative of the substrate entering into the processing chamber, and
   wherein the driving assembly is configured to drive, when the substrate comes into no contact with the driving assembly from in contact with the driving assembly, the rotation shaft to rotate about the axis of the rotation shaft along a second direction opposite to the first direction, and the substrate sensing assembly is configured to stop transmitting the first sensing signal upon sensing the rotation of the rotation shaft along the second direction.

2. The substrate processing apparatus according to claim 1, wherein the substrate sensing assembly comprises a substrate sensor and a sense element, one of the substrate sensor and the sense element is configured to rotate with the rotation of the rotation shaft, and the other one of the substrate sensor and the sense element is provided stationary with respect to the processing chamber;
   the substrate sensor and the sense element are configured to be close to each other when the rotation shaft rotates by a first angle along the first direction, such that the sense element enters into a sensing range of the substrate sensor, and the substrate sensor transmits the first sensing signal; and
   the substrate sensor and the sense element are configured to be away from each other when the rotation shaft rotates by a second angle along the second direction, such that the sense element is out of the sensing range of the substrate sensor, and the substrate sensor stops transmitting the first sensing signal.

3. The substrate processing apparatus according to claim 2, wherein the substrate sensing assembly further comprises a mounting bracket provided stationary with respect to the processing chamber, and the other one of the substrate sensor and the sense element stationary with respect to the processing chamber is fixedly provided on the mounting bracket.

4. The substrate processing apparatus according to claim 2, wherein the substrate sensor is provided stationary with respect to the processing chamber, and the sense element is fixedly provided on the rotation shaft so as to rotate with the rotation of the rotation shaft.

5. The substrate processing apparatus according to claim 3, wherein the substrate sensor is provided on the mounting bracket, and the sense element is fixedly provided on the rotation shaft; and
   the substrate processing apparatus further comprises an initial position sensor provided on the mounting bracket, the initial position sensor and the substrate sensor are positioned at two ends of a movement trajectory of the sense element, respectively; the driving assembly is configured to fixes, when the driving assembly is not in contact with the substrate, the rotation shaft at an initial position such that the sense element is in a sensing range of the initial position sensor, and the initial position sensor is configured to transmits a second sensing signal when the sense element is in the sensing range of the initial position sensor.

6. The substrate processing apparatus according to claim 5, wherein the substrate sensor comprises a first groove, and the initial position sensor comprises a second groove; the first groove and the second groove are configured such that one end of the sense element enters into the first groove when the driving assembly comes into contact with the substrate, and the other end of the sense element enters into the second groove when the driving assembly is not in contact with the substrate.

7. The substrate processing apparatus according to claim 5, wherein the sense element has an annulus-sector shape, and the substrate processing apparatus further comprises a supporting rod, one end of which is fixedly provided on the rotation shaft, the other end of which is fixedly provided with the sense element thereon, and an extension line of which crosses the axis of the rotation shaft, a center of a circle of the sense element being on the supporting rod.

8. The substrate processing apparatus according to claim 1, wherein the driving assembly comprises a lever fixedly connected to the rotation shaft, a counterweight provided at one end of the lever and a contact member provided at the other end of the lever, the lever being configured to drive the rotation shaft to rotate about the axis of the rotation shaft when the contact member comes into contact with the substrate; and the substrate processing apparatus further comprises a counterweight stopper provided inside the processing chamber and under the lever, the counterweight stopper being configured to stop the one end of the lever provided with the counterweight when the contact member is not in contact with the substrate.

9. The substrate processing apparatus according to claim 8, a distance between the counterweight and a connection point of the lever with the rotation shaft is less than a distance between the contact member and the connection point of the lever with the rotation shaft.

10. The substrate processing apparatus according to claim 8, wherein the contact member comprises a roller configured to roll when the substrate comes into contact with an outer surface of the roller and presses down the lever.

11. The substrate processing apparatus according to claim 8, wherein the counterweight stopper comprises a stop bar, and the substrate processing apparatus further comprises a mounting rod, one end of which is provided with the stop bar, and the other end of which is configured to fix the mounting rod inside the processing chamber, the mounting rod and the stop bar being perpendicular to each other.

12. The substrate processing apparatus according to claim 11, further comprising an adjustment mechanism, wherein the mounting rod is a telescopic rod, and the adjustment mechanism comprises an operation part and an execution part connected between the mounting rod and the operation part, the operation part being provided outside the processing chamber so that a force applied to the operation part is transmitted to the mounting rod through the execution part to control the mounting rod to be lengthened or shortened.

13. The substrate processing apparatus according to claim 1, further comprising a controller and a spraying mechanism, the spraying mechanism being provided inside the processing chamber, and the controller being configured to control, upon receiving the first sensing signal, the spraying mechanism to spray.

14. The substrate processing apparatus according to claim 2, further comprising a controller and a spraying mechanism, the spraying mechanism being provided inside the processing chamber, and the controller being configured to control, upon receiving the first sensing signal, the spraying mechanism to spray.

15. The substrate processing apparatus according to claim 5, further comprising a controller and a spraying mechanism, the spraying mechanism being provided inside the processing chamber, and the controller being configured to control, upon receiving the second sensing signal, the spraying mechanism to stop spraying.

16. The substrate processing apparatus according to claim 6, further comprising a controller and a spraying mechanism, the spraying mechanism being provided inside the processing chamber, and the controller being configured to control, upon receiving the second sensing signal, the spraying mechanism to stop spraying.

17. The substrate processing apparatus according to claim 7, further comprising a controller and a spraying mechanism, the spraying mechanism being provided inside the processing chamber, and the controller being configured to control, upon receiving the second sensing signal, the spraying mechanism to stop spraying.

18. The substrate processing apparatus according to claim 1, further comprising a plurality of transmission shafts provided inside the processing chamber, wherein the rotation shaft is provided between two adjacent transmission shafts.

19. The substrate processing apparatus according to claim 2, further comprising a plurality of transmission shafts provided inside the processing chamber, wherein the rotation shaft is provided between two adjacent transmission shafts.

20. The substrate processing apparatus according to claim 1, wherein the rotation shaft has a rod shape, and at least one of two ends of the rotation shaft is provided outside the processing chamber.

* * * * *